(12) United States Patent
Machida et al.

(10) Patent No.: US 8,425,026 B2
(45) Date of Patent: Apr. 23, 2013

(54) ELECTROMECHANICAL TRANSDUCER FILM AND METHOD FOR MANUFACTURING ELECTROMECHANICAL TRANSDUCER FILM

(75) Inventors: Osamu Machida, Kanagawa (JP); Yoshikazu Akiyama, Kanagawa (JP); Keiji Ueda, Kanagawa (JP); Akira Shimofuku, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 289 days.

(21) Appl. No.: 13/004,203

(22) Filed: Jan. 11, 2011

(65) Prior Publication Data

US 2011/0175967 A1 Jul. 21, 2011

(30) Foreign Application Priority Data

Jan. 15, 2010 (JP) ................ 2010-007431

(51) Int. Cl.
*B41J 2/04* (2006.01)
*B41J 2/17* (2006.01)

(52) U.S. Cl.
USPC ............................................. 347/96; 347/21

(58) Field of Classification Search ............ 347/21, 347/96
See application file for complete search history.

(56) References Cited

U.S. PATENT DOCUMENTS

| | | | |
|---|---|---|---|
| 6,127,129 A | 10/2000 | Corn et al. | |
| 7,279,823 B2 | 10/2007 | Higuchi et al. | |
| 7,612,455 B2 | 11/2009 | Tano et al. | |
| 7,713,348 B2 | 5/2010 | Kijima et al. | |
| 2004/0101980 A1 | 5/2004 | Kurokawa et al. | |
| 2004/0151014 A1* | 8/2004 | Speakman | 365/49 |

FOREIGN PATENT DOCUMENTS

| | | |
|---|---|---|
| JP | 04-168277 | 6/1992 |
| JP | 2002-543429 | 12/2002 |
| JP | 2003-297825 | 10/2003 |
| JP | 2005-310962 | 11/2005 |
| JP | 4269172 | 5/2009 |
| WO | WO 00/67028 | 11/2000 |
| WO | WO 03/098714 | 11/2003 |

OTHER PUBLICATIONS

K.D. Budd, S.K. Dey, D.A. Payne, British Ceramic Society Proceedings 36, 107, 1985.
A. Kumar, G.M. Whitesides, Applied Physics Letters 63, 2002, 1993.

* cited by examiner

*Primary Examiner* — Jerry Rahll
(74) *Attorney, Agent, or Firm* — IPUSA, PLLC

(57) ABSTRACT

A method for manufacturing an electromechanical transducer film including a lower electrode and plural layers of a sol-gel solution film formed on the lower electrode by an inkjet method, the method including the steps of a) modifying a surface of the lower electrode, b) forming a first sol-gel solution film on the surface of the lower electrode by ejecting droplets of a sol-gel solution to the surface of the lower electrode, and c) forming a second sol-gel solution film on the first sol-gel solution film by ejecting droplets of the sol-gel solution to a surface of the first sol-gel solution film. Adjacent dots formed on the surface of the lower electrode by the droplets ejected in step b) overlap each other. Adjacent dots formed on the surface of the first sol-gel solution film by the droplets ejected in step c) do not overlap each other.

11 Claims, 15 Drawing Sheets

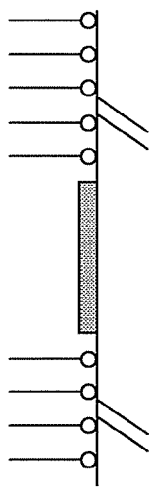
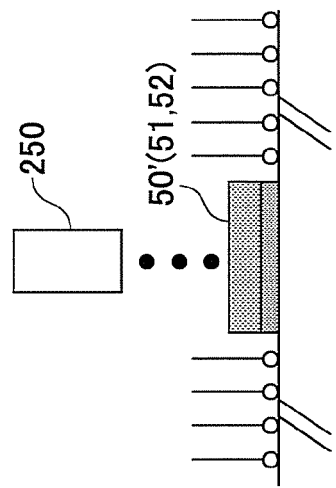
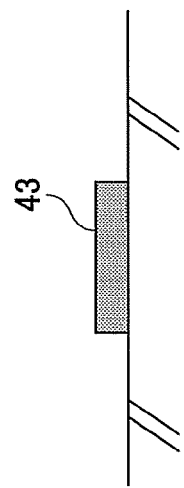
FIG.2D  FIG.2E  FIG.2F
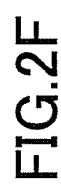
FIG.2A  FIG.2B  FIG.2C

ELECTROMECHANICAL TRANSDUCER FILM AND METHOD FOR MANUFACTURING ELECTROMECHANICAL TRANSDUCER FILM

BACKGROUND OF THE INVENTION

1. Field

The embodiments discussed herein are related to an electromechanical transducer film and a method for manufacturing the electromechanical transducer film.

2. Description of the Related Art

References related to embodiments discussed herein are as follows.

In non-patent document 1 (K. D. Budd, S. K. Dey, D. A. Payne, British Ceramic Society Proceedings 36, 107, 1985), there is introduced a technology related to forming a thin film of a metal complex oxide by using a sol-gel method.

In non-patent document 2 (A. Kumar, G. M. Whitesides, Applied Physics Letters 63, 2002, 1993), it is described that alkanethiol can be formed as a self-assembled monolayer (SAM) on an Au film. It is also described that a SAM pattern can be transferred with a micro-contact printing method using this phenomenon and used in a subsequent process such as etching.

In patent document 1 (Japanese National Publication of International Patent Application No. 2002-543429), there is introduced a technology of forming biological molecules and a cell array by forming an alkanethiol, having the ends of the SAM molecules chemically modified, on a reaction substrate surface and partially removing the SAM by UV irradiation.

In patent document 2 (Japanese Laid-Open Patent Publication No. 04-168277), it is described that a complex oxide thick film is formed on a substrate using an sol-gel method and applied to an actuator or a sensor for a spatial light modulator or inkjet head of a printer.

In patent document 3 (Japanese Laid-Open Patent Publication No. 2005-310962), it is described that a laminated structure 1 is constituted of a wettability change layer 2 which contains a material which varies a critical surface tension by application of energy and has at least two regions where the critical surface tensions are different, consisting of the high surface energy part 3 of a higher critical surface tension and the low surface energy part 4 of a lower critical surface tension, a conductive layer 5 formed in the region of the high surface energy part 3 based on the wettability change layer 2, and a semiconductor layer 6 provided so as to come into contact with at least the region of the low surface energy part 4 based on the wettability change layer 2. Thus, the laminated structure 1 is formed to have a fine conductive layer which can be simply manufactured by the method at a low cost and a high material use efficiency as the printing method, and the semiconductor layer 6 of a high mobility.

In patent document 4 (Japanese Laid-Open Patent Publication No. 2003-297825), there is disclosed a method of fabricating a ferroelectric thin film by using two or more inkjet heads, different sol-gel solutions and evenly mixing the different sol-gel solutions on a plane.

In patent document 5 (International Publication Pamphlet No. WO 2003/098714), there is disclosed a typical configuration of a liquid jet head using a piezoelectric thin film.

In patent document 6 (Japanese Patent No. 4269172), there is disclosed a method for manufacturing a ferroelectric film by having an inkjet head eject a sol-gel solution which is prepared for the inkjet head.

[Conventional Method for Forming Individual Piezoelectric Elements]

A piezoelectric film formed of a metal complex oxide is deposited on a lower electrode by using known depositing techniques such as a vacuum deposition method (e.g., sputtering method, MO-CVD method (chemical vapor deposition using metal oxide), an ion-plating method), sol-gel method, a hydrothermal synthesis method, an AD (aerosol deposition) method, an MOD (metal organic decomposition) method. Then, after forming an upper electrode on the piezoelectric film, patterning is performed on the upper electrode by photolithography and etching. Then, in a similar manner, patterning is performed on the piezoelectric film and the lower electrode. Thereby, individualization of piezoelectric elements is achieved.

A metal complex oxide (particularly, PZT (lead zirconate titanate)) is a material that cannot be easily dry-etched. A Si (silicon) semiconductor device can be easily etched by using a RIE (Reactive Ion Etching) method. However, because the material used for forming the Si semiconductor device increases the plasma energy of ions, the material used for forming the Si semiconductor device requires a special type of RIE using ICP (Inductively Coupled Plasma), ECR (Electron Cyclotron Resonance) plasma, and helicon plasma together. This results in an increase of manufacturing cost. In addition, it is difficult for a substrate to improve a selection ratio with respect to the lower electrode. Particularly, an uneven etching rate is a critical problem for a substrate having a large area.

Although the aforementioned etching process can be omitted if a PZT film (being difficult to etch) can be formed only at a desired part of a lower electrode beforehand, attempts for forming the PZT film in such manner have hardly been made.

[Conventional Method for Forming Individual PZT Films]

Thermal decomposition method: Because PZT can be selectively grown on a Ti metal by performing a thermal decomposition method, a PZT film can be formed only at a desired part by performing a patterning process on a Ti electrode. In order to obtain a PZT film having sufficient pressure-resistance by using the thermal decomposition method, it is preferable to form a relatively thick PZT film having a thickness of 5 μm or more. If the thickness of the PZT film is less than 5 μm, the PZT film can be easily destroyed by applying an electric field thereto. Thus, the PZT film cannot be formed as a thin film having a desired thickness. In a case of forming a device (element) on a Si substrate, the Si substrate will require protection because thermal decomposition is performed on the Si substrate in a strong alkaline solution.

Vacuum decomposition method: In manufacturing an organic EL (electroluminescent) device, a luminescent layer is patterned by using a shadow mask. The shadow mask is typically formed of a stainless material. Meanwhile, a PZT film is to be deposited in a state where the temperature of the substrate is 500-600° C. Because complex oxide is required to be crystallized on a substrate for generating a piezoelectric characteristic, the substrate is heated to 500-600° C., so that such crystallized complex oxide film can be obtained. Thus, due to a thermal expansion difference between a Si substrate and a stainless material, satisfactory masking cannot be achieved in a case where a stainless shadow mask is used. In addition, the use of a disposable shadow mask is unrealistic. Particularly, in a case where a MO-CVD method or a sputtering method is used on a substrate, the deposited film tends to come around to the other side or another part of the substrate. Therefore, the MO-CVD method and the sputtering method are particularly unsuitable.

AD method: With the AD method, a resist pattern is formed on a substrate beforehand by photolithography, so that a PZT film can be formed in an area(s) of the substrate with no resist pattern (resist film). The same as the above-described thermal decomposition method, the AD method is suitable for fabricating a thick film but not suitable for fabricating a thin film having a thickness equal to or less than 5 μm. Because PZT film is also deposited on the resist film, a liftoff process is to be performed after a portion of the deposited PZT film is removed by a grinding process. It is, however, difficult to perform grinding evenly on a large area. Further, because the resist film has no heat resistance, deposition with the AD method is performed at room temperature.

Then, the deposited film is converted to a film having a piezoelectric characteristic after being subject to a post-anneal process.

Sol-gel method: In a case of using a sol-gel method where a coating of ink is applied to a surface of a substrate formed of platinum by performing an inkjet technique, the ink dedicated for the inkjet method tends to wet and spread on the surface of the platinum substrate. This is because the ink dedicated for the inkjet technique has a low viscosity. Further, in a case where a large amount of ink is applied at a single time in the sol-gel method, a "coffee stain phenomenon" occurs in which a center portion of the ink coating is thin whereas the edges of the ink coating are thick (protrude). Therefore, the sol-gel method is unsuitable for forming a thick film.

SUMMARY OF THE INVENTION

The present invention may provide an electromechanical transducer film and a method for manufacturing the electromechanical transducer film that substantially eliminate one or more of the problems caused by the limitations and disadvantages of the related art.

Features and advantages of the present invention are set forth in the description which follows, and in part will become apparent from the description and the accompanying drawings, or may be learned by practice of the invention according to the teachings provided in the description. Objects as well as other features and advantages of the present invention will be realized and attained by an electromechanical transducer film and a method for manufacturing the electromechanical transducer film particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a method for manufacturing an electromechanical transducer film including a lower electrode and plural layers of a sol-gel solution film formed on the lower electrode by an inkjet method, the method including the steps of: a) modifying a surface of the lower electrode; b) forming a first sol-gel solution film on the surface of the lower electrode by ejecting droplets of a sol-gel solution to the surface of the lower electrode; and c) forming a second sol-gel solution film on the first sol-gel solution film by ejecting droplets of the sol-gel solution to a surface of the first sol-gel solution film; wherein adjacent dots formed on the surface of the lower electrode by the droplets ejected in step b) overlap each other, and wherein adjacent dots formed on the surface of the first sol-gel solution film by the droplets ejected in step c) do not overlap each other.

Another embodiment of the present invention provides an electromechanical transducer element including: a lower electrode having a modified surface; plural layers of a sol-gel solution film formed on the lower electrode; and an upper electrode formed on the plural layers of the sol-gel solution film; wherein the plural layers of the sol-gel solution film includes a first sol-gel film formed on the modified surface by ejecting droplets of a sol-gel solution to the modified surface and a second sol-gel film formed on a surface of the first sol-gel solution film by ejecting droplets of the sol-gel solution to the surface of the first sol-gel solution film, wherein adjacent dots formed on the modified surface by the droplets overlap each other, and wherein adjacent dots formed on the surface of the first sol-gel solution film by the droplets do not overlap each other.

Other objects, features and advantages of the present invention will become more apparent from the following detailed description when read in conjunction with the accompanying drawings.

BRIEF DESCRIPTION OF THE DRAWINGS

FIGS. 2A-2F are schematic diagrams for describing steps of applying a sol-gel solution to a hydrophilic portion of a surface of a substrate with an inkjet technique according to an embodiment of the present invention;

DETAILED DESCRIPTION OF THE PREFERRED EMBODIMENTS

Figure 1A:
FIGS. 1A-1D are schematic diagrams for describing the steps for modifying a surface of an electrode formed on a substrate according to an embodiment of the present invention.

As described below, an electromechanical transducer film and a method for manufacturing the electromechanical transducer film according to an embodiment of the present invention may be applied to an inkjet head (hereinafter also referred to as "liquid jet head") used for an inkjet apparatus (hereinafter also referred to as "liquid jet apparatus") and an image forming apparatus (hereinafter also referred to as "inkjet recording apparatus") (e.g., a printer, a fax machine, a copier, or a multifunction machine having functions of printer, a fax machine, and/or a copier) including the inkjet apparatus.

An exemplary configuration of the inkjet head according to an embodiment of the present invention may include a nozzle for ejecting ink droplets, a compression chamber (also referred to as an ink flow path, pressure liquid chamber, a pressure chamber, an ejection chamber, a liquid chamber) communicating with the nozzle, and an energy generating part (pressure generating part) for applying pressure to the ink inside the compression chamber. The energy generating part may be an electromechanical transducer element (e.g., a piezoelectric element), an electrothermal element (e.g., a heater), or an energy generating element including a vibration plate serving as a wall of an ink flow path and an electrode facing the vibration plate. More specifically, the pressure generating part according to an embodiment of the present invention may be a piezo-type pressure generating part causing ink ejection by using an electromechanical transducer element (e.g., piezoelectric element) for deforming a vibration plate formed as a wall of the liquid chamber (ejection chamber) or a bubble type pressure generating part (thermal type pressure generating part) causing ink ejection by using an electrothermal transducer element provided inside the liquid chamber for generating bubbles by boiling the ink inside the liquid chamber. In addition, the piezo-type pressure generating part includes a longitudinal type that uses deformation in a d33 direction, a horizontal type (bending mode type) that uses deformation in a d31 direction, and a shear mode type that uses shearing deformation. Further, owing to advances in semiconductor processing and MEMS (Micro Electro Mechanical Systems), there is also a thin film actuator having a liquid chamber and a piezoelectric element fabricated inside a Si substrate. The electromechanical element in the below-described first embodiment of the present invention is a bending mode piezo-type pressure generating part that uses deformation in the d31 direction.

With such configuration, the inkjet head can eject ink droplets from the nozzle by generating energy with the energy generating part and using the generated energy for applying pressure to the ink inside the compression chamber.

According to an embodiment of the present invention, the electromechanical transducer element includes a substrate forming a part of the compression chamber (pressure chamber), a lower electrode (first electrode) formed on the substrate via a vibration plate and/or a buffer layer, an electromechanical transducer layer (electromechanical transducer film) formed on the first electrode, and an upper electrode (second electrode) formed on the electromechanical transducer layer.

According to an embodiment of the present invention, the inkjet head may have plural pressure chambers. In this case, an individual piezoelectric element may be provided in correspondence with each pressure chamber and may be generically named as the electromechanical transducer element. According to an embodiment of the present invention, the electromechanical transducer element, which converts electric input into mechanical deformation, has a layered configuration including a pair of electrodes (upper and lower electrodes) and a piezoelectric member (e.g., piezoelectric film) provided between the pair of electrodes. The piezoelectric member may be formed of a PZT (lead zirconate titanate) ceramic. Because plural metal oxides are the main component of PZT, PZT may be referred to as a metal complex oxide.

Further, a method for manufacturing an electromechanical transducer film (PZT film) patterned by a sol-gel method is described below as one example of a method for manufacturing an electromechanical transducer element including an electromechanical transducer film according to an embodiment of the present invention.

In this example, a PZT precursor solution is applied to a distinguished portion(s) of the surface of a substrate (substrate surface) for controlling wettability of the substrate surface. This example uses a self assembling phenomenon caused by applying alkanethiol to a specific metal (as described in non-patent document 2). This example is described in further detail below.

Alkanethiol being applied to a platinum group metal forms a self-assembled monolayer (SAM).

Thus, in this example, the SAM is formed on the entire surface of a lower electrode formed of platinum (Pt).

The surface of the SAM becomes hydrophobic due to an alkyl group arranged on the surface of the SAM.

The SAM is patterned by performing well-known photolithography and etching processes on the SAM.

Because there is a patterned SAM remaining on the platinum even after removal of resist used in the photolithography process, the area of the lower electrode on which the SAM remains is hydrophobic whereas the area of the lower electrode from which the SAM is removed (i.e. platinum surface) is hydrophilic.

A PZT precursor is applied to the hydrophilic area by using an inkjet method. The viscosity and surface tension of the PZT precursor is modified so that the PZT precursor can be suitably applied from an inkjet head.

Owing to the difference (contrast) of surface energy of the lower electrode, only the hydrophilic area is coated by the PZT precursor.

Thereby, a first patterned PZT precursor film is formed by the inkjet method. Then, a thermal process is performed on the first patterned PZT precursor film in a same manner as a typical sol-gel method.

After the first patterned PZT precursor film dries, a peripheral edge part of the first patterned PZT precursor film protrudes. Accordingly, in a case of forming second or more layers of PZT precursor films (coatings) on the lower electrode by applying a PZT solution with the inkjet method, the protrusion of the first patterned PZT precursor film prevents the PZT solution from spreading to areas other than a target coating area. Accordingly, there is no need to process (modify) the surface of the lower electrode beforehand in the case of forming the second or more PZT precursor films (coatings) on the lower electrode with the inkjet method.

Thereby, the process for forming layers of a PZT precursor film can be shortened. By repeating the process of applying the PZT solution with the inkjet method, a PZT precursor film having a desired thickness can be obtained.

In the following, embodiments of the present invention are described in further detail with reference to the accompanying drawings.

First Embodiment

An embodiment of a method for manufacturing an electromechanical transducer film 43 using a sol-gel method is described.

Figure 1B:
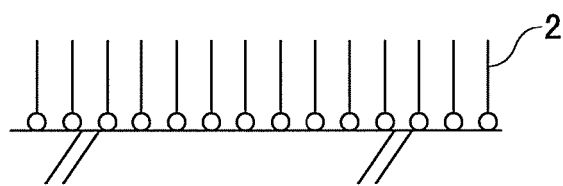
Figure 1C:
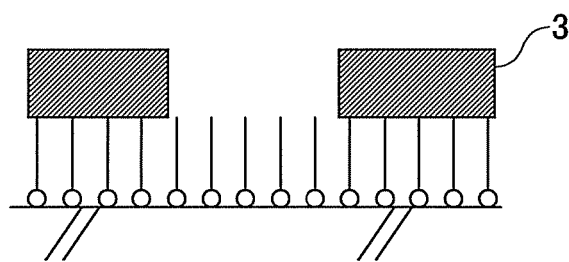
Figure 1D:
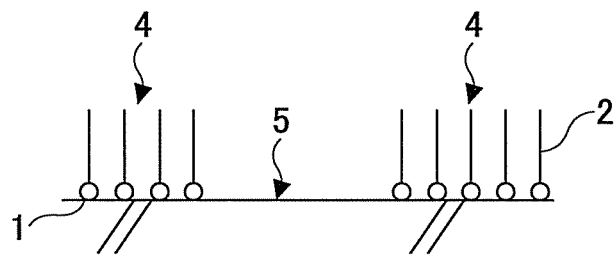

FIGS. 1A-1D are schematic diagrams for describing the steps for modifying a surface of an electrode formed on a substrate 1 according to an embodiment of the present invention. FIG. 1A illustrates the substrate 1 in a state where a first electrode (not illustrated in FIGS. 1A-1D and FIGS. 2A-2F) is formed on the surface of the substrate 1 by a sputtering method. In this embodiment, the first electrode is a platinum electrode. It is to be noted that the first electrode is described in further detail below and indicated with reference numeral 42 in the below-described FIGS. 4-6, and 11. FIG. 1B illustrates the substrate 1 in a state where a SAM (Self Assembled Monolayer) 2 is formed entirely on the surface of the substrate 1. In this embodiment, the SAM 2 is formed by dipping the substrate 1 into an alkanethiol liquid, to thereby obtain a layer of self-organized molecules. In this embodiment, $CH_3(CH_2)$—SH is used. FIG. 1C illustrates the substrate 1 in a state where a pattern of photo-resist (photo-resist pattern) 3 is formed on the SAM 2 by using a photolithography technique. The photo-resist pattern 3 is formed for the purpose of enabling removal of a portion of the SAM 2 at which a PZT (lead zirconate titanate) precursor is to be formed (for the purpose of protecting a necessary portion of the SAM 2). For example, in the state illustrated in FIG. 1C, the portion of the SAM 2 at which the PZT precursor is to be formed (target removal portion) is removed by irradiating oxygen plasma to the surface of the substrate 1. FIG. 1D illustrates the substrate 1 in a state where the photo-resist 3 is removed after the removing of the target removal portion of the SAM 2. The SAM 2 obtained by performing the steps illustrated with FIGS. 1A-1D has a hydrophobic property (portion indicated with reference numeral 4 and hereinafter referred to as "hydrophobic portion") and exhibits a contact angle of 92 degrees with respect to pure water. The Pt portion (portion indicated with reference numeral 5 and hereinafter referred to as "hydrophilic portion") of the surface of the substrate 1 from which the target removal portion of the SAM 2 has been removed has a hydrophilic property and exhibits a contact angle of 54 degrees with respect to pure water. Although the target removal portion of the SAM 2 is removed by irradiating oxygen plasma in this embodiment, the target removal portion of the SAM 2 may alternatively be removed by irradiating UV (ultraviolet) light.

FIGS. 2A-2F are schematic diagrams for describing the steps of applying a sol-gel solution to the hydrophilic portion of the surface of substrate 1 (illustrated in FIG. 1D) with an inkjet technique according to an embodiment of the present invention. In the state illustrated in FIGS. 1D and 2A where a pattern including the hydrophobic portion 4 and the hydrophilic portion 5 is formed on the substrate 1, a PZT precursor solution serving as the sol-gel liquid is applied to the hydrophilic portion (i.e. a hydrophilic area of the platinum electrode (not illustrated) formed on the surface of the substrate 1) of the substrate 1 by ejecting the PZT precursor solution from an inkjet head (liquid jet head) 250 of a below-described inkjet coating apparatus (liquid jet apparatus) 82 as illustrated in FIGS. 2B and 2E.

Figure 3:
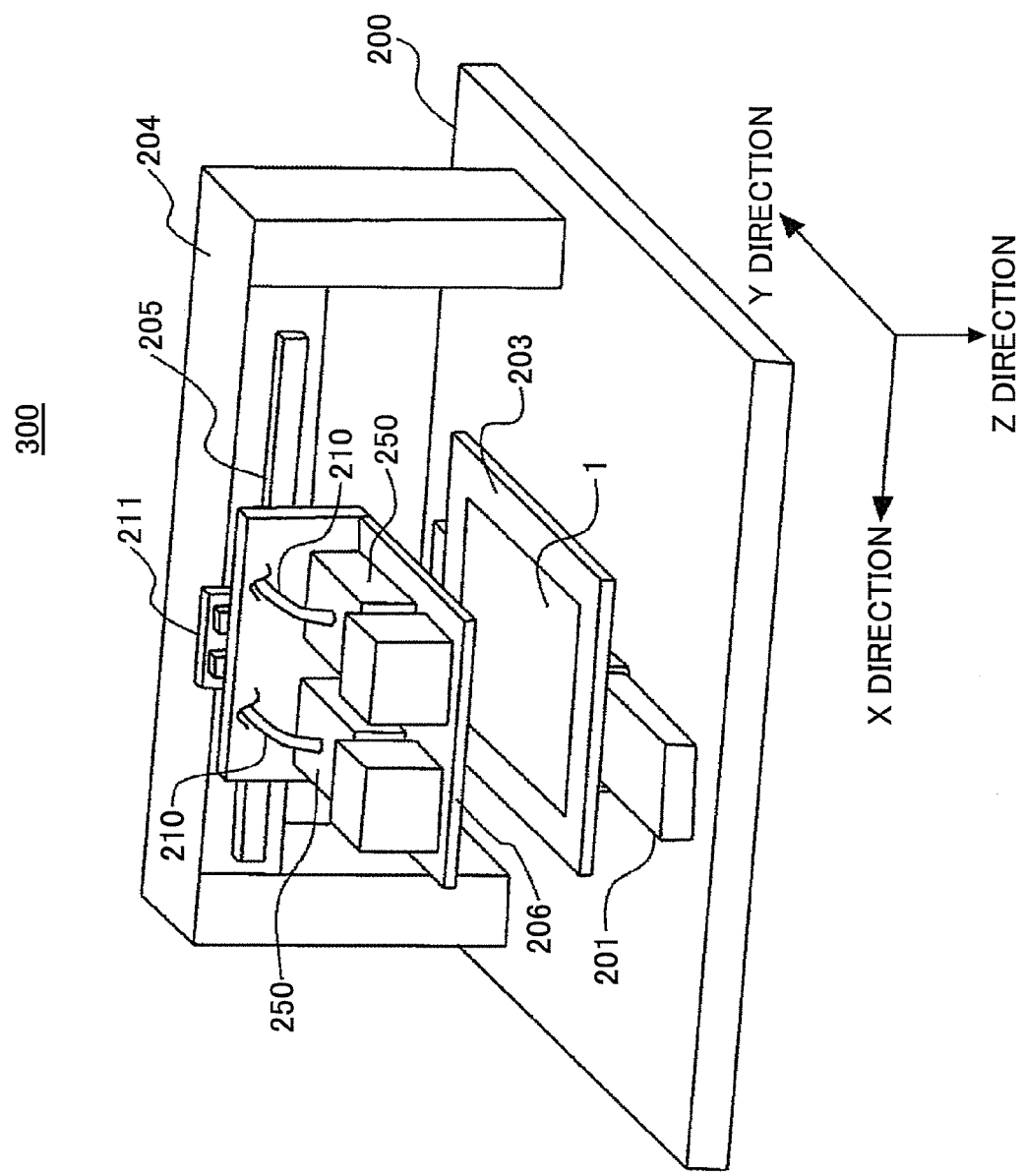
FIG. 3 is a perspective view for describing an example of an inkjet coating apparatus including an inkjet head used in FIGS. 2B and 2E according to an embodiment of the present invention.

FIG. 3 is a perspective view for describing an example of the inkjet coating apparatus 300 including the inkjet head 250 used in FIGS. 2B and 2E. The inkjet coating apparatus 300 includes a pedestal 200 on which a Y axis driving part 201 is mounted. Further, a stage 203 is mounted on the Y axis driving part 201. The Y axis driving part 201 is mounted on the pedestal 200 in a manner enabling the stage 203 to be moved (driven) in a Y direction. The substrate 1 is to be attached onto the stage 203. The stage 203 includes an attaching part (not illustrate) for fixing the substrate 1 thereon. The attaching part may fix the substrate 1 onto the stage, for example, by a vacuum attracting force or an electrostatic attracting force.

Further, the inkjet coating apparatus 300 includes an X axis driving part 205 attached to an X axis supporting part 204. Further, a head-base 206 is attached to the X axis supporting part 204 via a Z axis driving part 211 in a manner enabling the head-base 206 to move in the Z direction and the X direction. In this example, two inkjet heads 250 are mounted on the head-base 206 for ejecting one or more types of liquids (e.g., PZT precursor solution, platinum ink) to the substrate 1. Each inkjet head 250 includes a tank (not illustrated) containing a type of liquid corresponding to the tank. A liquid supplying pipe 210 supplies the liquid to the corresponding tank.

The starting materials for forming the PZT precursor solution serving as the sol-gel liquid are lead acetate trihydrate, titanium isopropoxide, and zirconium normal butoxide. The crystal water of lead acetate is dehydrated after being dissolved in methoxyethanol. Lead of 10 mol % is provided in excess to the stoichiometric composition for preventing reduction of crystallinity due to a so-called lead-loss that occurs during a thermal process.

Titanium isopropoxide and zirconium normal butoxide are dissolved in methoxyethanol for promoting an alcohol exchange reaction and an esterification reaction and are mixed with the aforementioned methoxyethanol having the lead acetate dissolved therein. Thereby, the PZT precursor solution is synthesized. In this embodiment, the concentration of the PZT precursor solution is 0.1 mol/liter.

Figure 4:
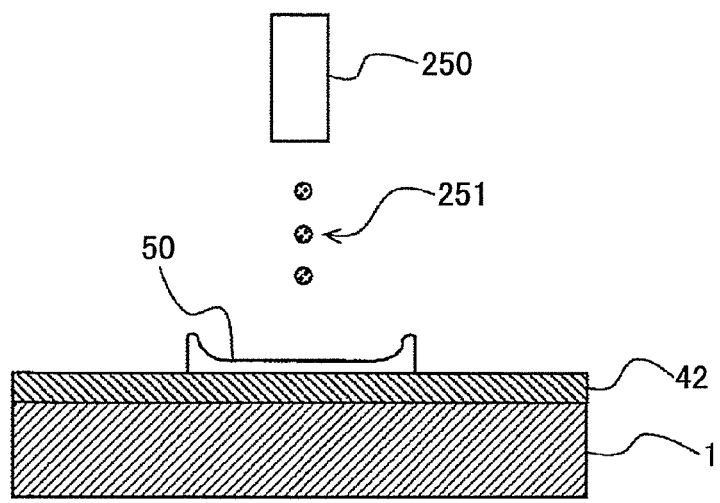
FIG. 4 is a schematic diagram for describing a state where a first layer of a sol-gel solution (PZT precursor) film is formed on a lower electrode by using a liquid jet head according to an embodiment of the present invention.

It is preferable to attain a film thickness of 100 nm in a single film deposition process. Accordingly, the concentration of the PZT precursor solution is optimized in view of a relationship between a film deposition area and a precursor deposition (coating) amount. FIG. 2B and FIG. 4 illustrate a state where a first PZT precursor film (i.e. first layer of the electromechanical transducer film 43) is formed by ejecting a PZT precursor solution 251 from the inkjet head 250 of the inkjet coating apparatus 300 to a first electrode (lower electrode) 42 of the substrate 1 (i.e. the hydrophilic portion 5 of the substrate 1). Owing to different contact angles (contrast of contact angle) of the areas above the substrate 1, the PZT precursor solution 251 forms a pattern in which the PZT precursor solution 251 spreads only at the hydrophilic area of the substrate 1. Furthermore, a coffee stain phenomenon occurs at the area where the PZT precursor solution 251 is applied because the PZT precursor solution 251 dries relatively quickly. Accordingly, the edge parts of the first PZT precursor film 50 protrudes to form a bank-like shape as illustrated in FIG. 4.

Then, a first thermal process (solution drying) is performed on the first PZT precursor film 50 in which the first PZT precursor film 50 is heated at a temperature of 120 and then subject to a pyrolysis process (thermal decomposition of organic material). Thereby, as illustrated in FIG. 2C, the first PZT precursor film 50 (which may also be used as an electromechanical transducer film) is formed having a film thickness of 90 nm.

The substrate 1 illustrated in FIG. 4 is formed of silicon (Si) and may be used as a pressure chamber substrate (described below).

Figure 5:
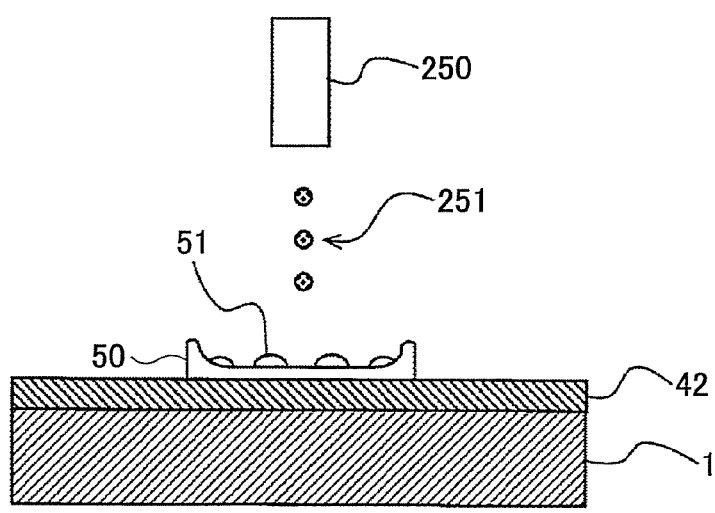
FIG. 5 is a schematic diagram for describing a state where a second layer of a sol-gel solution (PZT precursor) is formed for the first time by using a liquid jet head according to an embodiment of the present invention.
Figure 6:
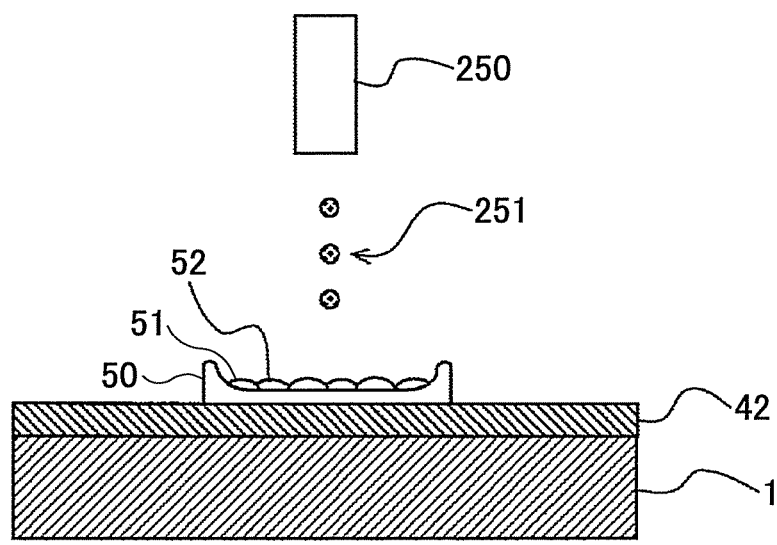
FIG. 6 is a schematic diagram for describing a state where a second layer of a sol-gel solution (PZT precursor) is formed for the second time by using a liquid jet head according to an embodiment of the present invention.

After the first PZT precursor film 50 (first layer of the electromechanical transducer film 43) is formed, PZT precursor solution 251 is again ejected from the inkjet head 250 of the inkjet coating apparatus 300 to the first electrode (lower electrode) 42 of the substrate 1 (i.e. the hydrophilic portion 5 of the substrate 1) for forming a second PZT precursor film 50' (i.e. second layer of the electromechanical transducer film 43) as illustrated in FIG. 2E. However, the second PZT precursor film 50' (second layer of the electromechanical transducer film 43) is formed by performing the precursor solution ejection twice on the first PZT precursor film 50. That is, the second PZT precursor film 50' (second layer of the electromechanical transducer film 43) is formed by forming a first pattern of dots 51 and forming a second pattern of dots 52 separately on the first PZT precursor film 50. For the first time of ejecting the precursor solution 251 to the first PZT precursor film 50, the first pattern of dots 51 is formed by ejecting the precursor solution 251 to the first PZT precursor film 50 in a spaced apart manner so that adjacent dots 51 do not contact each other. FIG. 5 illustrates a state immediately after forming the first pattern of dots 51 on the first PZT precursor film 50 (i.e. a state immediately after completing the first ejection of the PZT precursor solution 251). Accordingly, neither a leveling phenomenon of the PZT precursor solution 251 (a phenomenon where the ejected dots of the PZT precursor solution 251, as a whole, form a flat plane on the surface of the first PZT precursor film 50) nor a coffee stain phenomenon of the PZT precursor solution 251 (a phenomenon where the ejected dots of the PZT precursor solution 251, as a whole, form a pattern having protruding edge parts when the PZT precursor solution 251 becomes dry) occurs because the dots 51 that form the first pattern of the second PZT precursor film 50' do not contact each other. Further, owing to the relatively fast drying property of the PZT precursor solution 251, the dots 51 can be prevented from migrating because the dots 51 become dry maintaining a dot-like shape. In addition, owing to the relatively fast drying property of the PZT precursor solution 251, the second ejection of the PZT precursor solution 251 can be continuously performed after the first ejection of the PZT precursor solution 251. FIG. 6 illustrates a state after forming the second pattern of dots 52 on the first PZT precursor film 50 (i.e. a state after completing the second ejection of the PZT precursor solution 251). In the second ejection of the PZT precursor solution 251, although the dots 52 of the second pattern are formed in the spaces between the dots 51 that form the first pattern, the dots 52 do not migrate because the dots 51 of the first pattern have already dried. In the state after completing the second ejection of the PZT precursor solution 251, a film including the first and second PZT precursor films 50, 50' (which can also be used as an electromechanical transducer film 43) is formed with a thickness of 180 nm.

Figure 7:
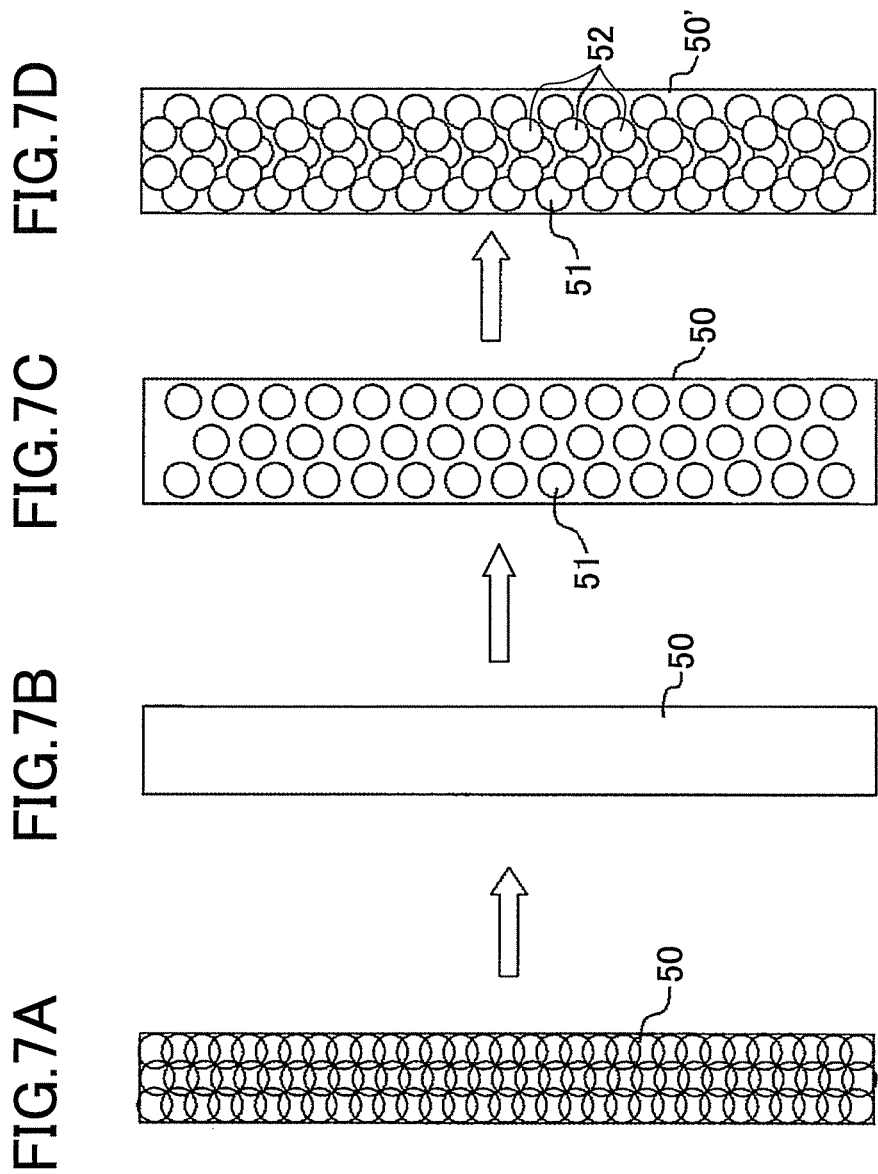
FIGS. 7A-7D are plan views for describing transition from coating a first layer of a sol-gel solution to coating a second layer of a sol-gel solution according to an embodiment of the present invention.

FIGS. 7A-7D are plan views of the first electrode 42 for describing the states of the first and second layers (first and second PZT precursor films 50, 50') of electromechanical transducer film 43. In a state immediately after forming the first PZT precursor film 50, dots formed by the droplets of the PZT precursor solution 251 contact (overlap) each other on the surface of the first electrode 42 (FIG. 7A). Thereby, the first PZT precursor film 50 becomes substantially flat due to a leveling phenomenon caused by the contacting dots (FIG. 7B). After forming the first pattern of dots 51 of the second PZT precursor film 50', each of the dots 51 dries in a manner maintaining a dot-like shape because the dots 51 formed on the surface of the first PZT precursor film 50 do not contact each other (FIG. 7C). Accordingly, the first pattern of dots 51 does not spread on the surface of the first PZT precursor film 50. Further, the second pattern of dots 52 is formed on the surface of the first PZT precursor film 50 in a state where the (non-contacting) dots 51 are dry (FIG. 7D). In the same manner as forming the first pattern of dots 51, the second pattern of dots 52 is prevented from spreading on the surface of the first PZT precursor film 50 (FIG. 7D).

Particularly, the spreading of the second pattern of dots 52 can be positively prevented by forming the first and second patterns of dots 51, 52 in a manner that the area on which the second pattern of dots 52 is formed is smaller than the area on which the first pattern of dots 51 is formed. This is because the bank-like protrusions formed at the peripheral edges of the first PZT precursor film 50 prevent spreading of the dots 51, 52 formed in the area surrounded by the protrusions (see FIG. 4).

In this example, by repeating the steps illustrated in FIGS. 4-6 for six times, a film including plural layers of the first and second PZT precursor films 50, 50' (which can also be used as the electromechanical transducer film 43) is formed with a thickness of 540 nm. Then, a thermal process is performed on the film including plural layers of the first and second PZT precursor films 50, 50' for crystallization. In this embodiment, the thermal process is performed by using a RTA (Rapid Thermal Annealing) method. In performing the thermal process, no defects such as cracks are found in the film including plural layers of the first and second PZT precursor films 50, 50'. Then, an operation including i) a SAM process, ii) a selective applying of the precursor solution 251 (i.e. selectively ejecting the precursor solution 251 to predetermined areas of the surface of the film including plural layers of the first and second PZT precursor films 50, 50'), iii) a drying process (in this embodiment, drying at a temperature of 120° C.), and iv) a thermal process for crystallization (in this embodiment, performing thermal decomposition at a temperature of 500° C.) is further performed on the film including plural layers of the first and second PZT precursor films 50, 50' for six times. In performing this operation, no defects such as cracks are found in the film including plural layers of the first and second PZT precursor films 50, 50'. Thereby, a film including the first and second PZT precursor films 50, 50' (which can also be used as the electromechanical transducer film 43) is formed with a thickness of 1000 nm.

Figure 8:
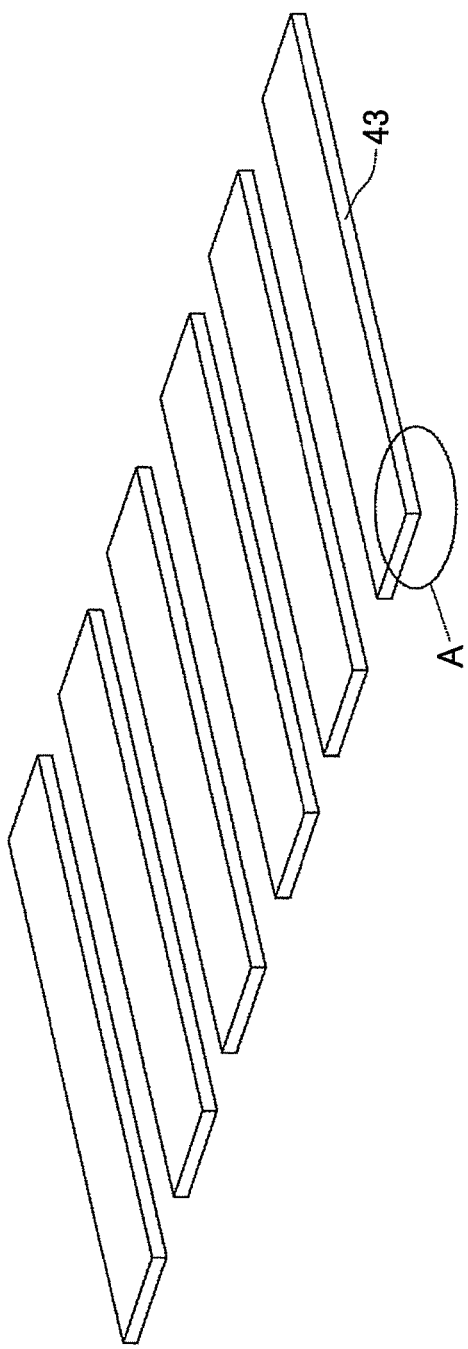
FIG. 8 illustrates an example having a group of electromechanical transducer films aligned in parallel.

FIG. 8 illustrates an example having a group of electromechanical transducer films 43 aligned in parallel.

Figure 9:
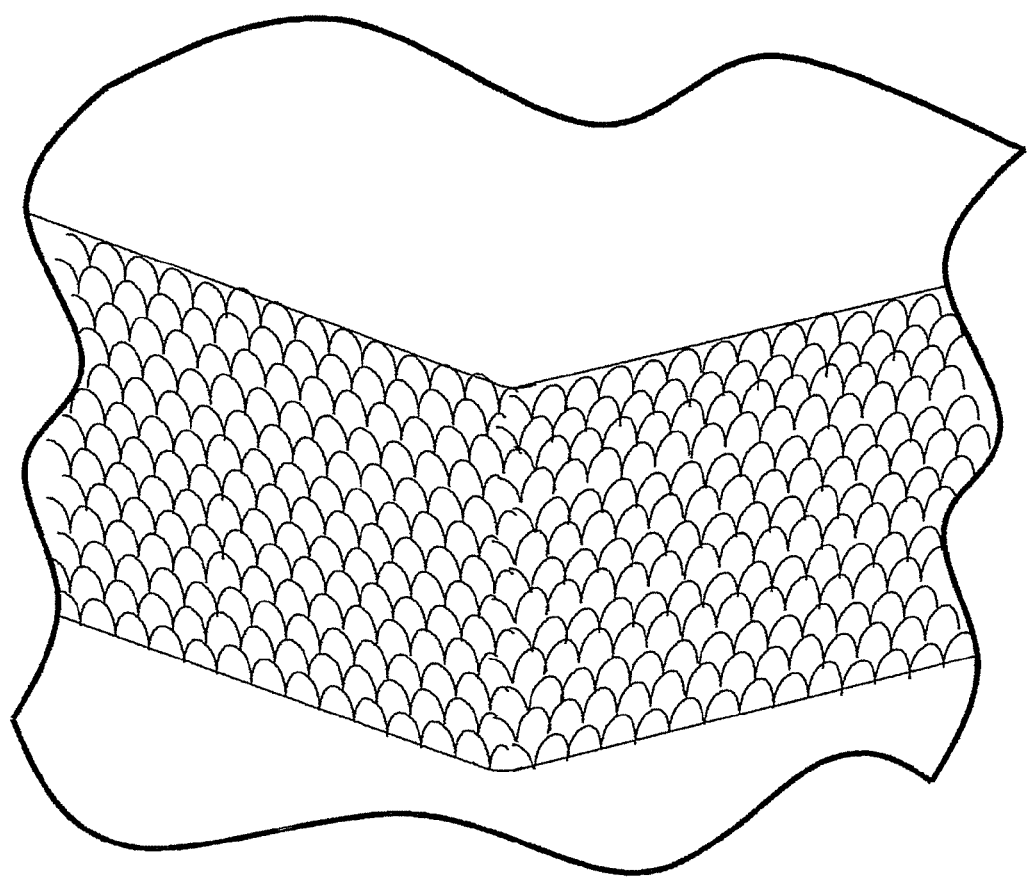
FIG. 9 is an enlarged view of a portion A of one of the electromechanical transducer films illustrated in FIG. 8.

FIG. 9 is an enlarged view of a portion A of one of the electromechanical transducer films 43 illustrated in FIG. 8. By repeating the ejection of the precursor solution 251 illustrated in FIGS. 7A-7D, droplets of the precursor solution 251 can be superposed one on top of the other (in manner similar to stacking blocks) while maintaining their shape. Thereby, the electromechanical transducer film 43 can be formed with a desired thickness.

An electromechanical transducer element 40 (described in detail below) can be formed by depositing a platinum film on the electromechanical transducer film 43. The platinum film acts as an upper electrode (second electrode) 44 of the electromechanical transducer element 40. The above-described first electrode 42 acts as a lower electrode of the electromechanical transducer element 40.

Evaluation of the electric characteristics and electromechanical transduction property (piezoelectric constant) was performed on the electromechanical transducer element 40 according to an embodiment of the present invention.

Figure 10:
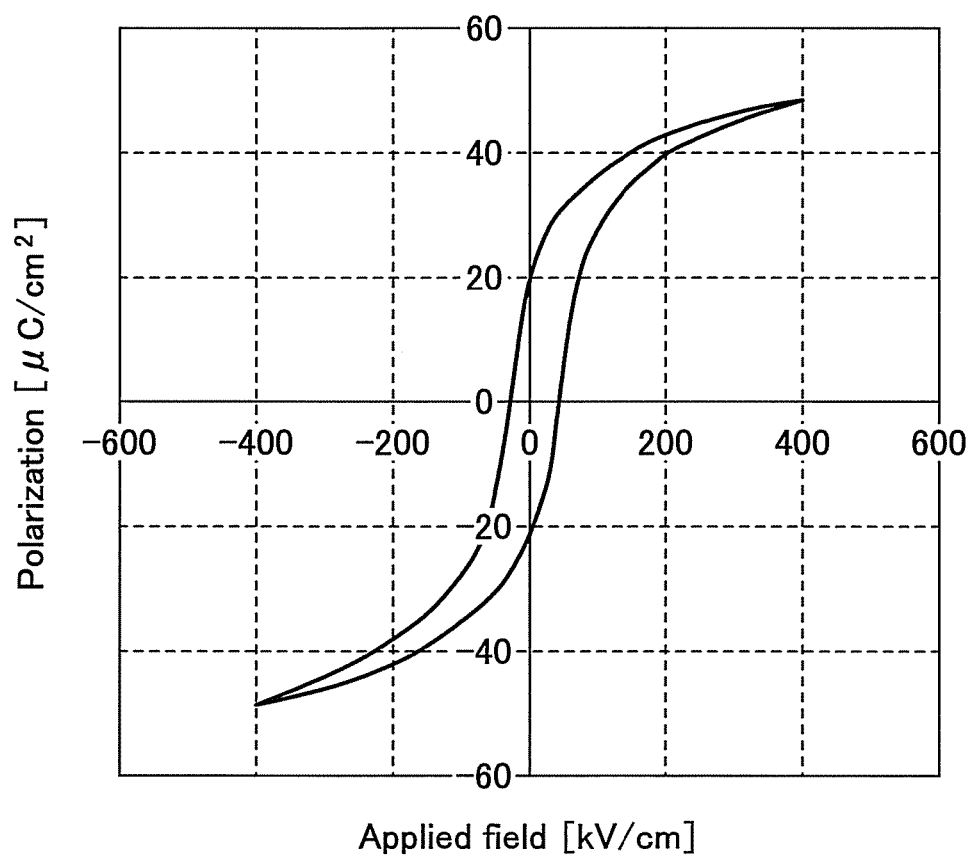
FIG. 10 is a graph illustrating a hysteresis curve of an electromechanical transducer film (PZT film) according to an embodiment of the present invention.

According to an embodiment of the present invention, the relative dielectric constant of the electromechanical transducer film 43 of the electromechanical transducer element 40 was 1220, the dielectric loss was 0.02, the residual dielectric polarization was 19.3 µC/cm$^2$, and the coercive electric field was 36.5 kV/cm. Thus, the electromechanical transducer film 43 has substantially the same electric characteristics as those of a regular ceramic sintered body. The P-E hysteresis curve of the electromechanical transducer film 43 according to an embodiment of the present invention is illustrated in FIG. 10.

The electromechanical transduction property (piezoelectric constant) of the electromechanical transducer film 43 was obtained (calculated) by using a laser Doppler vibrometer for measuring the amount of deformation when applying an electric field to the electromechanical transducer film 43 and calibrating the measurement result with simulation results. The obtained piezoelectric constant (d31) of the electromechanical transducer film 43 was 120 pm/V. Thus, the electromechanical transducer film 43 has substantially the same electromechanical transduction property (piezoelectric constant) as that of a regular ceramic sintered body. The obtained electromechanical transduction property (piezoelectric constant) of the electromechanical transducer film 43 signifies that a liquid jet head can be positively designed by using the electromechanical transducer film 43.

Alternatively, in a case of further increasing the thickness of the above-described electromechanical transducer film 43 having a thickness of 540 nm instead of forming the upper electrode on top of the electromechanical transducer film 43, an operation including the steps illustrated in FIGS. 4-6 and the crystallization process (e.g., by thermal decomposition annealing) are further performed for six times on the electromechanical transducer film 43 having a thickness of 540 nm. Then, the operation including the steps illustrated in FIGS. 4-6 and the crystallization process (e.g., by thermal decomposition annealing) are further performed for ten times. Thereby, the thickness of the electromechanical transducer film 43 can be increased to 5 µm. No defects such as cracks are found in the electromechanical transducer film 43.

Second Embodiment

Figure 11:
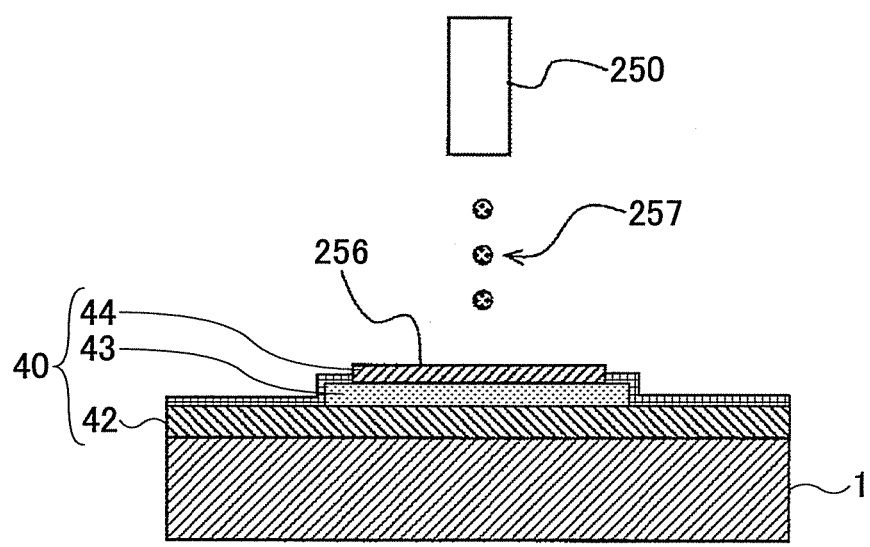
FIG. 11 is a schematic diagram illustrating a state of forming an upper electrode (second electrode) using an inkjet method according to an embodiment of the present invention.

The second electrode (upper electrode) 44 of the electromechanical transducer element 40 is formed by ejecting droplets of platinum ink 257 from the inkjet head 250 onto a predetermined portion of the surface of the electromechanical transducer film 43 as illustrated in FIG. 11. In the same manner as the above-described coating process of the PZT precursor solution 251, the area on which the second electrode 44 is formed is specified by utilizing the different contact angles (contrast of contact angle) of the surface of the electromechanical transducer film 43. Because the second electrode 44 is to be formed in an area smaller than the electromechanical transducer film 43 for preventing short-circuiting of the second electrode 44, a hydrophobic portion(s) is to be formed on the surfaces of the electromechanical transducer film 43 (including first and second PZT precursor film 50, 50') and the first electrode 42. Therefore, as illustrated in FIG. 11, a pattern of resist (resist pattern) 252 is formed on areas where the coating of the platinum ink 257 (second electrode 44) is not to be formed. The resist pattern 252 is removed after the coating of the platinum ink 257 is dried at 120° C. After the removing of the resist pattern 252, the coating of the platinum ink 257 is sintered at 250° C. After the sintering of the coating of platinum ink 257, the upper electrode 44 having a thickness of 0.5 µm can be obtained. The resistivity of the upper electrode 44 is 5×10$^{-6}$ Ω·cm.

Third Embodiment

As for other platinum group elements which may be used for depositing a film corresponding to the first electrode (lower electrode) 42, there is, for example, ruthenium, iridium, or rhodium. Accordingly, the deposition is performed by, for example, sputtering ruthenium, iridium, or rhodium to a silicon wafer 20 having a thermal oxide film 30 and a titanium bonding film 41 formed thereon. The methods of modifying the surface of the first electrode 42 and forming the SAM are the same as those described in the first embodiment. The first electrode (lower electrode) 42 may also be formed by depositing a platinum group alloy such as a platinum-rhodium alloy (rhodium concentration: 15 wt %). The first electrode (lower electrode) 42 may also be formed by depositing an iridium metal film or a platinum film on an iridium oxide film.

Figure 12B:
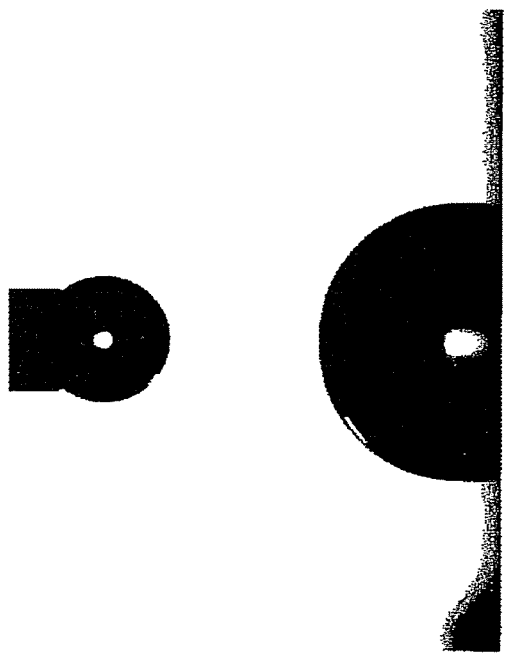
FIGS. 12A and 12B are schematic diagrams for describing results of measuring contact angle of a platinum film according to an embodiment of the present invention.
Figure 12A:
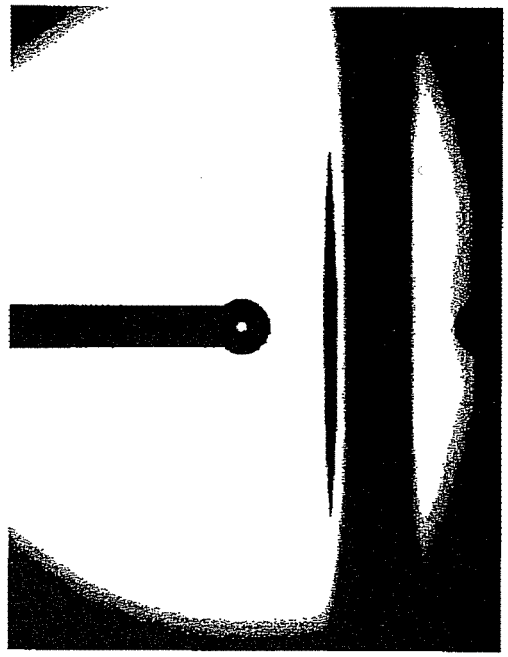

In the above-described cases where the first electrode 42 is a film formed of i) platinum or another platinum group element (e.g., ruthenium, iridium, or rhodium), ii) an oxide of platinum or another platinum group element, iii) a platinum group alloy, or iv) a group layers including the films of i)-iii), the portion of the surface of the first electrode 42 from which the SAM is removed (i.e. hydrophilic portion 5 of FIGS. 1D and 2A) exhibits a contact angle of approximately 5 degrees or less with respect to water (perfect wetting) whereas the portion of the surface of the first electrode 42 on which the SAM is formed (i.e. hydrophobic portion 4 of FIGS. 1D and 2A) has a contact angle of approximately 90 degrees. FIGS. 12A and 12B illustrate the results in measuring the contact angle from specimens corresponding to the above-described cases where the first electrode 42 is a film formed of i) platinum or another platinum group element (e.g., ruthenium, iridium, or rhodium), ii) an oxide of platinum or another platinum group element, iii) a platinum group alloy, or iv) a group layers including the films of i)-iii). FIG. 12A illustrates that the portion of the surface of the first electrode 42 on which the SAM is formed exhibits a contact angle of approximately 90 degrees with respect to water. FIG. 12B illustrates that the portion of the surface of the first electrode 42 from which the SAM is removed exhibits a contact angle of approximately 5 degrees.

Based on the results illustrated in FIGS. 12A and 12B, the first electrode 42 may be formed of of i) platinum or another platinum group element (e.g., ruthenium, iridium, or rhodium), ii) an oxide of platinum or another platinum group element, iii) a platinum group alloy, or iv) a group of layers including the films of i)-iii). Similarly, the second electrode (upper electrode) 44 may also be formed of i) platinum or another platinum group element (e.g., ruthenium, iridium, or rhodium), ii) an oxide of platinum or another platinum group element, iii) a platinum group alloy, or iv) a group of layers including the films of i)-iii).

Fourth Embodiment

Figure 13:
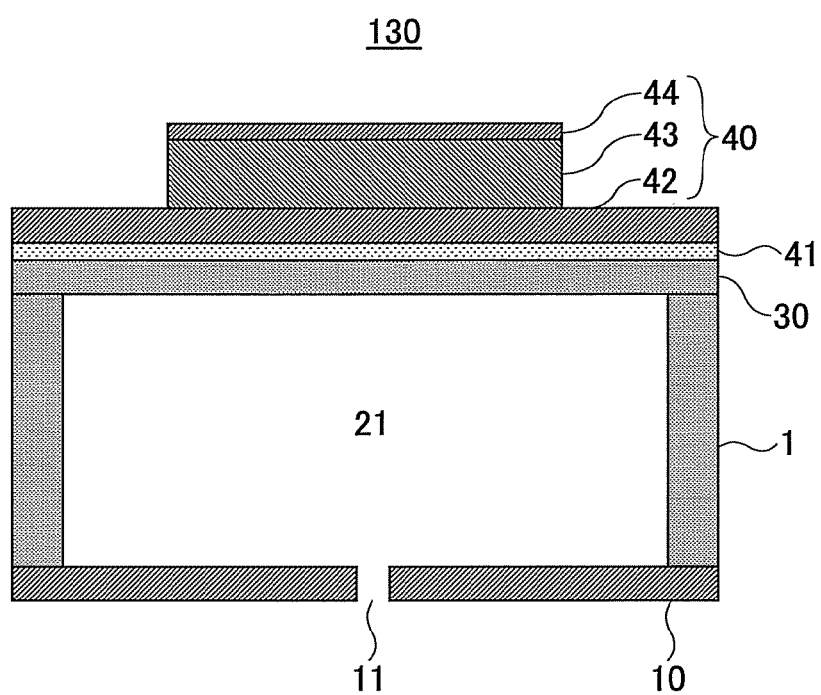
FIG. 13 is a schematic diagram illustrating an exemplary configuration of a liquid jet head according to an embodiment of the present invention.

FIG. 13 illustrates an exemplary configuration of a liquid jet head 130 having a single nozzle and including the above-described electromechanical transducer element 40 according to an embodiment of the present invention. The liquid jet head 130 includes a pressure chamber substrate (e.g., silicon (Si) substrate) 20 having a pressure chamber 21 provided therein. A vibration plate (e.g., Si thermal oxide film) 30 and a bonding film (e.g., titanium bonding film) 41 are formed on the Si substrate 20 in this order. The electromechanical transducer element 40 including the first electrode (lower electrode) 42, the electromechanical transducer film 43, and the second electrode (upper electrode) 44 is formed on the bonding film 41. A nozzle plate 10 having a nozzle hole 11 is bonded to a lower portion of the pressure chamber substrate 20.

Figure 14:
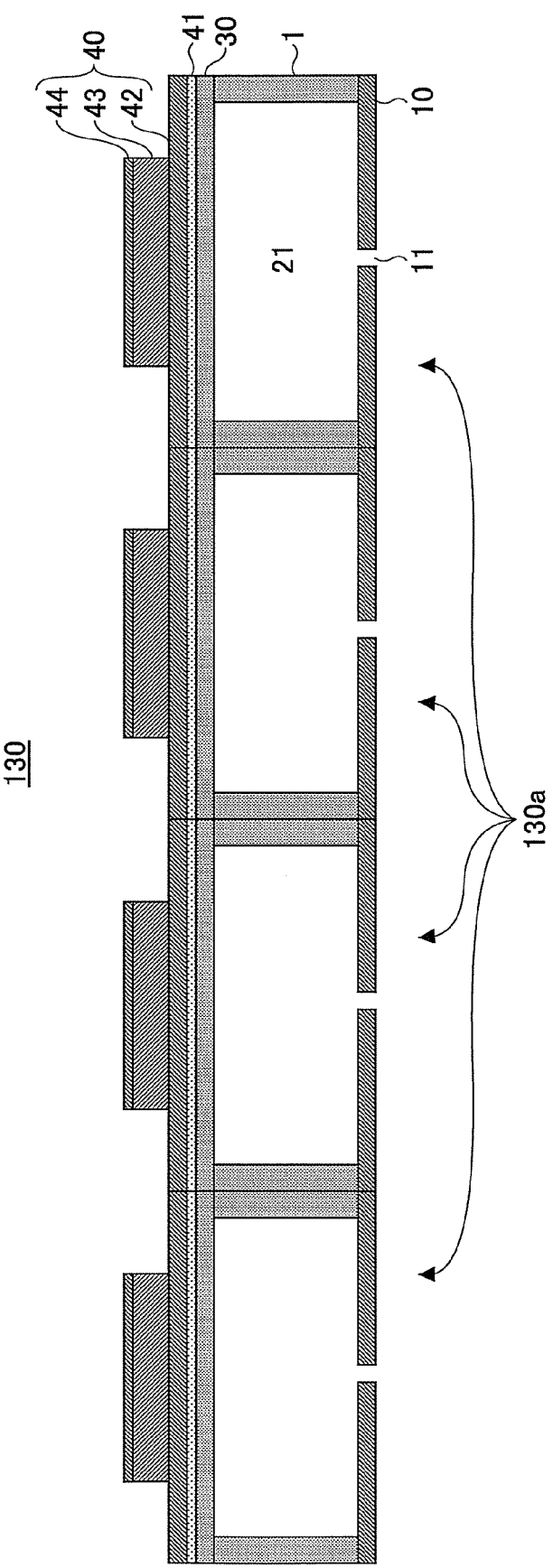
FIG. 14 is a schematic diagram illustrating another exemplary configuration of a liquid jet head having plural electromechanical transducer elements according to an embodiment of the present invention.

FIG. 14 illustrates another exemplary configuration of the liquid jet head 130 including plural liquid jet head parts (inkjet head parts) 130a according to an embodiment of the present invention. Each liquid jet head part 130a includes a corresponding electromechanical transducer element 40. The configuration of each liquid jet head part 130a is substantially the same as the configuration of the liquid jet head 130 illustrated in FIG. 13.

According to the third embodiment of the present invention, the electromechanical transducer element 40 can be formed on the pressure chamber substrate 20 via the vibration plate 30 and the bonding film 41 by simply using the manufacturing method described in the first embodiment of the present invention. The electromechanical transducer element 40 formed on the pressure chamber substrate 20 via the vibration plate 30 and the bonding film 41 can attain substantially the same performance as a bulk ceramic body. Further, after forming the electromechanical transducer element 40 on the pressure chamber substrate 20 via the vibration plate 30 and the bonding film 41, the liquid jet head 130 illustrated in FIGS. 13 and 14 can be obtained by etching the pressure chamber substrate 20 for forming the pressure chamber 21 and bonding the etched pressure chamber substrate 20 to the nozzle plate 10 having the nozzle hole 11. It is to be noted that a liquid supplying part, a flow path, and a fluid resistor are not illustrated in the liquid jet head 130 of FIGS. 13 and 14.

Fifth Embodiment

Figure 15:
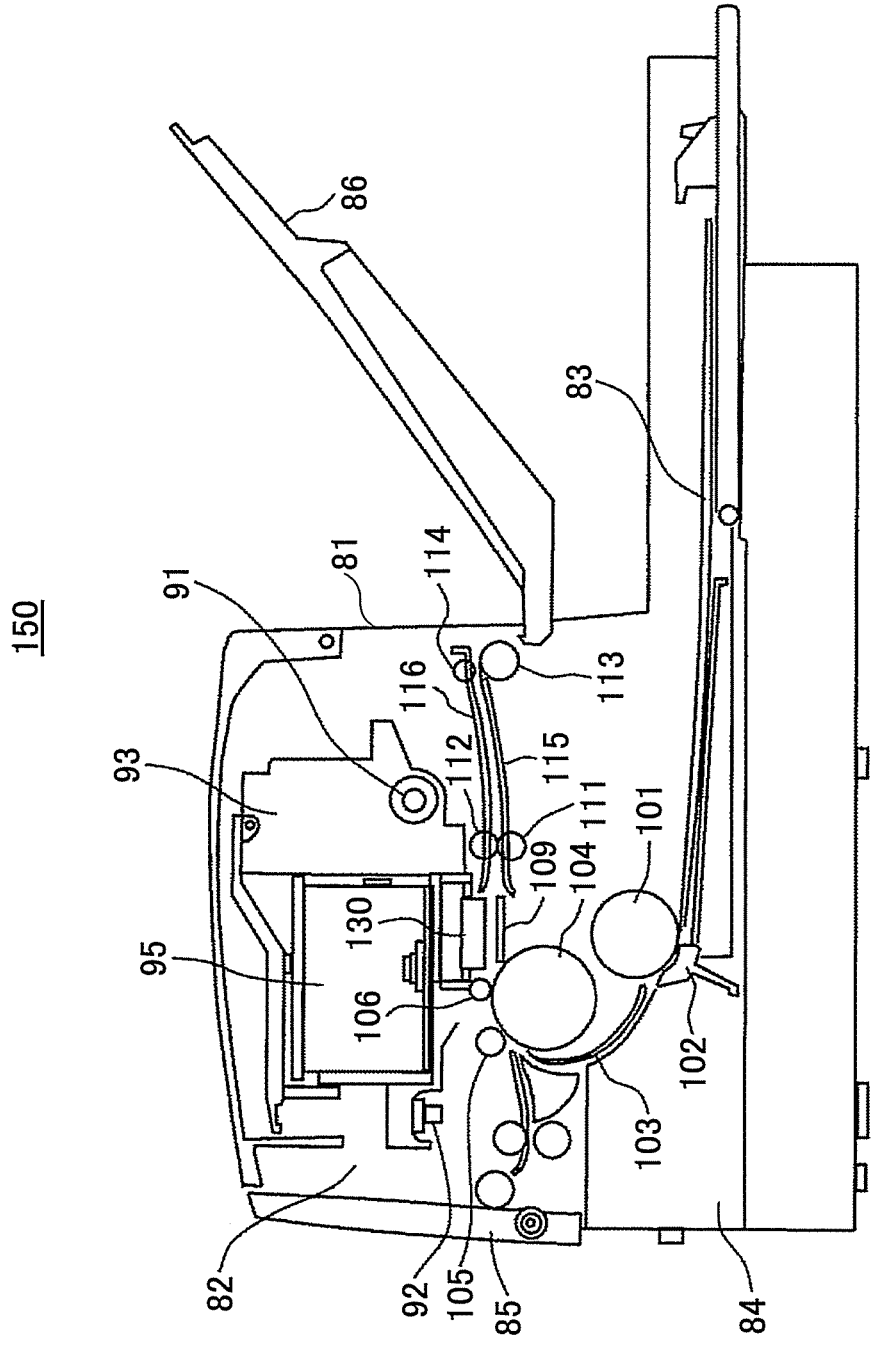
FIG. 15 is a schematic diagram illustrating an exemplary configuration of an image forming apparatus having a liquid jet apparatus including a liquid jet head according to an embodiment of the present invention.
Figure 16:
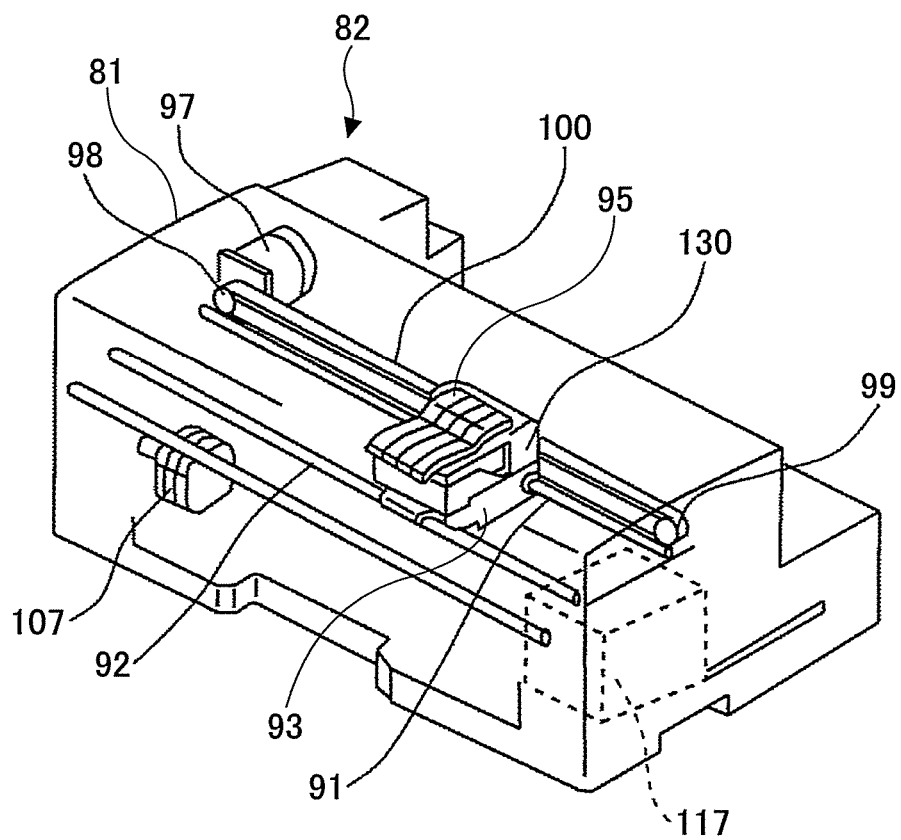
FIG. 16 is a schematic diagram illustrating an exemplary configuration of a liquid jet apparatus including a liquid jet head according to an embodiment of the present invention.

An example of an image forming apparatus (hereinafter also referred to as "inkjet recording apparatus") 150, which is installed with a liquid jet apparatus (inkjet apparatus) 82 including the liquid jet head (inkjet head) 130, is described with reference to FIGS. 15 and 16. FIG. 15 is a schematic perspective view of the inkjet recording apparatus 150 according to an embodiment of the present invention. FIG. 16 is a schematic view illustrating a printing mechanism part (i.e. inkjet apparatus 82) of the inkjet recording apparatus 150 according to an embodiment of the present invention.

With reference to FIG. 15, the inkjet recording apparatus 150 includes a main body 81 having the inkjet apparatus 82 installed therein. The inkjet apparatus 82 includes, for example, a carriage 93 capable of moving in a main scanning direction of the inkjet recording apparatus 150, the inkjet head 130 mounted to the carriage 93, and an ink cartridge 95 for supplying ink to the inkjet head 130. A paper-feed cassette (or a paper-feed tray) 84, being capable of mounting large amounts of sheets of paper 83 thereon, is detachably attached to a front lower portion of the main body 81. Further, a manual paper-feed tray 84 is openably provided on the front portion of the main body 81. Further, a paper discharge tray 86 is attached to a rear portion of the main body 81. Accordingly, a sheet of paper 83 fed from the paper-feed cassette 84 or the manual paper-feed tray 84 can have a predetermined image recorded thereon by the inkjet apparatus 82 and be discharged from the discharge tray 86.

In the inkjet apparatus (printing mechanism part) 82 of the inkjet recording apparatus 150 illustrated in FIG. 16, the carriage 93 is supported by a main guide rod 91 and a subordinate guide rod 92 in a manner enabling the carriage 93 to slide (move) in the main scanning direction of the inkjet recording apparatus 150. The inkjet head 130 is mounted to the carriage 93 in a manner that the ink ejecting direction is oriented downward. In this embodiment, the inkjet head 130 includes plural inkjet head parts 130a provided in correspondence with the colors of the ink to be ejected by the inkjet head 130 (i.e., yellow (Y), cyan (C), magenta (M), and black (Bk)) and aligned in a direction orthogonal to the main scanning direction of the inkjet recording apparatus 150. Plural exchangeable ink cartridges 95 corresponding to each color of the ink are attached to the carriage 93.

Each ink cartridge 95 has a porous body which is filled with corresponding ink. The porous body includes an atmosphere port (not illustrated) provided in communication with the atmosphere at an upper part of the porous body and a supply port (not illustrated) provided at a lower part of the porous body for supplying ink to the inkjet head 130. The inside of the ink cartridge 95 is maintained at a low negative pressure by the capillary pressure of the porous body. Although the inkjet head 130 of this embodiment is formed of plural separate inkjet head parts 130a corresponding to each color of ink, the inkjet head 130 may be formed having a single body with nozzles corresponding to each color of ink.

As illustrated in FIG. 16, the main guide rod 91 is attached to the rear side of the carriage (downstream side with respect to a paper conveying direction of the inkjet recording apparatus 150) and the sub-ordinate guide rod 92 is attached to the front side formed of the carriage 93 (upstream side with respect to the paper conveying direction of the inkjet recording apparatus 150). The main guide rod 91 and the sub-ordinate guide rod 92 are attached to the carriage 93 in a manner enabling the carriage 93 to slide in the main scanning direction of the inkjet recording apparatus 150. In order to move the carriage 93 in the main scanning direction of the inkjet recording apparatus 150, the carriage 93 is fixed (attached) to a timing belt 100 spanned by a driving pulley 98 and a driven pulley 99. The driving pulley 98 and the driven pulley 99 can be rotated by driving a main scanning motor 97. Accordingly, by rotating the driving pulley 98 and the driven pulley 99 back and forth with the main scanning motor 97, the carriage 93 fixed to the timing belt 100 can reciprocate along the main scanning direction of the inkjet recording apparatus 150.

Further, with reference to FIGS. 15 and 16, in order to convey the paper 83 mounted on the paper feed cassette 84 to a position below the inkjet head 130, the inkjet recording apparatus 150 includes a paper feed roller 101 and a friction pad for 102 for separating the paper 83 from the paper feed cassette 84, a guide member 103 for guiding the paper 83, a conveying roller 104 for flipping-over and conveying the paper 83, a conveying roller 105 for pressing against a peripheral surface of the conveying roller 104, and a tip roller 106 for defining the angle in which the paper 83 conveyed from the conveying roller 104 and delivered to the position below the inkjet head 130. The conveying roller 104 is rotated by driving a sub-scanning motor 107 via a gear chain (not illustrated).

As illustrated in FIG. 16, the inkjet recording apparatus 150 further includes a print receiving part 109 provided below the inkjet head 130 for guiding the paper 84 being conveyed from the conveying roller 104 in correspondence with the movement of the carriage 93 in the main scanning direction of the inkjet recording apparatus 94. Further, the inkjet recording apparatus 150 includes a conveying roller 111 and a spur 112 provided in a downstream side of the print receiving part 109 with respect to the paper conveying direction for delivering the paper 83 in a direction towards the paper discharge tray 86 (paper discharge direction). Further, the inkjet recording apparatus 150 includes a paper discharge roller and a spur 114 for delivering the paper 83 to the paper discharge tray 86, and guide members 115, 116 that form a paper discharge path.

In a case of performing a recording process on the conveyed paper 83 stopped at a predetermined position below the inkjet head 130, a first line of image data is recorded by moving the carriage 93 and ejecting ink from the inkjet head 130 to the conveyed paper 83 in response to image signals. Then, after the conveyed paper 84 is further conveyed a predetermined amount (distance) forward, the next line of the image data is recorded. After receiving a recording completion signal or a signal indicating that a rear end of the paper 83 has reached a predetermined recording area, the recording process is terminated and the paper 83 is discharged to the paper discharge tray 86.

As illustrated in FIG. 16, a recovery device 117 (depicted with dotted lines in FIG. 16) is provided at a position outside the recording area of the inkjet recording apparatus 150 (in this embodiment, right end side with respect to a carriage moving direction). The recovery device 117 is for recovering the ejecting performance and preventing ejection failure of the inkjet head 130. The recovery device 117 includes a cap part (not illustrated), an absorbing part (not illustrated), and a cleaning part (not illustrated). In a case where the carriage 93 is in a standby state, the carriage 93 is positioned towards the recovery device 117. In such position, the inkjet head 130 is covered (capped) by the capping part so that a nozzle part (including the nozzle plate 10, the nozzle hole 11) of the inkjet head 130 can be maintained in a moist state. Thereby, ejection failure due to drying of ink can be prevented. By ejecting undesired ink (ink that does not contribute to the recording process) beforehand, the ink ejected from the inkjet head 130 during the recording process can maintain a consistent viscosity. Thereby, a consistent inkjet performance can be maintained.

In a case where ejecting failure or the like has occurred, the recovery device 117 performs a recovery process for recovering ejecting performance and preventing ejection failure of the inkjet head 130. More specifically, the nozzle hole 11 of the inkjet head 130 is sealed by the capping part. Then, ink and bubbles are absorbed by the absorbing part via a tube. Then, the cleaning part removes undesired ink and residue adhered to the nozzle part of the inkjet head 130. In addition, the ink absorbed by the absorbing part is discharged to a waste ink accumulating part (not illustrated) to be absorbed by an ink absorber provided inside the waste ink accumulating part.

As illustrated in FIGS. 15 and 16, because the above-described embodiment of the inkjet recording apparatus 150 including the inkjet apparatus 82 is provided with the inkjet head 130, ejection failure due to driving failure of the vibration plate of the inkjet head can be prevented. Thereby, consistent ink ejection performance can be achieved and image quality can be improved.

The present invention is not limited to the specifically disclosed embodiments, and variations and modifications may be made without departing from the scope of the present invention.

The present application is based on Japanese Priority Application No. 2010-007431 filed on Jan. 15, 2010, the entire contents of which are hereby incorporated herein by reference.

What is claimed is:

1. A method for manufacturing an electromechanical transducer film including a lower electrode and a plurality of layers of a sol-gel solution film formed on the lower electrode by an inkjet method, the method comprising the steps of:
   a) modifying a surface of the lower electrode;
   b) forming a first sol-gel solution film on the surface of the lower electrode by ejecting droplets of a sol-gel solution to the surface of the lower electrode; and
   c) forming a second sol-gel solution film on the first sol-gel solution film by ejecting droplets of the sol-gel solution to a surface of the first sol-gel solution film;
   wherein adjacent dots formed on the surface of the lower electrode by the droplets ejected in step b) overlap each other, and
   wherein adjacent dots formed on the surface of the first sol-gel solution film by the droplets ejected in step c) do not overlap each other.

2. The method as claimed in claim 1, wherein the amount of the droplets ejected in step b) is less than the amount of the droplets ejected in step c).

3. The method as claimed in claim 1, wherein in step c), the second sol-gel solution film is formed in an area smaller than an area on which the first sol-gel solution film is formed.

4. The method as claimed in claim 1, wherein in step a), the surface of the lower electrode is modified by applying a thiol compound on the surface of the lower electrode, wherein the thiol compound is removed by performing photolithographic etching on the lower electrode after modifying the surface of the lower electrode.

5. A method for manufacturing an electromechanical transducer element comprising the steps of:
   manufacturing an electromechanical transducer film by executing the method claimed in claim 1; and
   forming an upper electrode on the electromechanical transducer film.

6. The method as claimed in claim 5, wherein the upper electrode is formed by using the inkjet method.

7. The method as claimed in claim 5, wherein the electromechanical transducer film is formed by using a metal complex oxide material, wherein the upper and lower electrodes are formed by depositing one or more layers of at least one of a platinum group element, an oxide of the platinum group element, and a platinum group alloy.

8. An electromechanical transducer element comprising:
   a lower electrode having a modified surface;
   a plurality of layers of a sol-gel solution film formed on the lower electrode; and
   an upper electrode formed on the plural layers of the sol-gel solution film;
   wherein the plural layers of the sol-gel solution film includes
      a first sol-gel film formed on the modified surface by ejecting droplets of a sol-gel solution to the modified surface and
      a second sol-gel film formed on a surface of the first sol-gel solution film by ejecting droplets of the sol-gel solution to the surface of the first sol-gel solution film,
   wherein adjacent dots formed on the modified surface by the droplets overlap each other, and
   wherein adjacent dots formed on the surface of the first sol-gel solution film by the droplets do not overlap each other.

9. A liquid jet head comprising:
   the electromechanical transducer element claimed in claim 8;
   a substrate having the electromechanical element formed thereon via a vibration plate and a bonding film; and
   a nozzle plate having a nozzle hole and being bonded to a lower portion of the substrate.

10. A liquid jet apparatus comprising:
    the liquid jet head claimed in claim 9; and
    a carriage on which the liquid jet head is mounted.

11. An image forming apparatus comprising:
    the liquid jet apparatus as claimed in claim 10; and
    a main body into which the liquid jet apparatus is installed.

* * * * *